(12) United States Patent
Liu et al.

(10) Patent No.: US 6,509,231 B1
(45) Date of Patent: Jan. 21, 2003

(54) NITRIDE READY ONLY MEMORY CELL WITH TWO TOP OXIDE LAYERS AND THE METHOD FOR MANUFACTURING THE SAME

(75) Inventors: Chen-Chin Liu, Douliou (TW); Li-Jen Chen, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 10 days.

(21) Appl. No.: 10/035,448

(22) Filed: Jan. 4, 2002

(51) Int. Cl.⁷ .............................................. H01L 21/336
(52) U.S. Cl. ........................ 438/261; 438/265; 438/593
(58) Field of Search ................................. 257/314, 315, 257/324; 365/185.24, 185.28, 185.29; 438/201, 257, 261, 265, 593, 595

(56) References Cited

U.S. PATENT DOCUMENTS

| | | | |
|---|---|---|---|
| 6,261,904 B1 | * 7/2001 | Pham et al. | 438/257 |
| 6,319,775 B1 | * 11/2001 | Halliyal et al. | 438/261 |
| 6,348,381 B1 | * 2/2002 | Jong et al. | 365/185.28 |
| 6,362,052 B1 | * 3/2002 | Rangarajan et al. | 438/258 |
| 6,381,179 B1 | * 4/2002 | Derhacobian et al. | 365/185.28 |
| 6,399,446 B1 | * 6/2002 | Rangarajan et al. | 438/262 |

\* cited by examiner

Primary Examiner—Olik Chaudhuri
Assistant Examiner—Hoai Pham
(74) Attorney, Agent, or Firm—Rosenberg, Klein & Lee

(57) ABSTRACT

A nitride ready only memory cell with two top oxide layers and the method for manufacturing the same are disclosed. By high temperature oxidation (HTO), a more oxide layer is deposited on the floating gate of the ONO structure (Oxide-Nitride-Oxide structure) as a protecting layer so as to prevent the charges trapped in the silicon nitride layer of the ONO floating gate from being discharged between a polysilicon layer and a nitride layer so as to increase the reliability of the memory.

12 Claims, 7 Drawing Sheets

NITRIDE READY ONLY MEMORY CELL WITH TWO TOP OXIDE LAYERS AND THE METHOD FOR MANUFACTURING THE SAME

BACKGROUND OF THE INVENTION

1. Field of the Invention

The present invention relates to a nitride ready only memory cell (NROM), and particularly to the nitride ready only memory cell with two top oxide layers and the method for manufacturing the same for avoiding the charge to drain out, which is used to increase the reliabilities of Erasable Programmable ROM (EPROM), Electrically Erasable Programmable ROM (EEPROM), Flash memory and embedded Flash, etc.

2. Description of Related Art

Memories are more and more important for current computer products. When the microprocessors of computers are enhanced, the operation amount of the software is also increased. Therefore, the demand of memories increases. To making memory with large capacity, quick speed, high reliability and a lower cost has become an important requirement in the semiconductor industry.

For example, in the manufacturing of nitride ready only memory cell (NORM cell), referring to FIG. 1, a semiconductor substrate 10 is provided. A silicon oxide layer 22, a silicon nitride layer 24 as the material of the floating gate, and a silicon oxide layer 26 are sequentially deposited thereon. These three layers are so called Oxide-Nitride-Oxide structure (briefly called as ONO layer). Next, this ONO layer is defined by photolithographic technology for deriving a plurality of ONO floating gate structures 20. Then, N+ ions are implanted between the plurality of ONO floating gate structures 20. After properly thermal diffusion, a buried ion diffusion area 30 is formed. Then, a buried oxide layer 32 is formed above the buried ion diffusion area. 30.

Next, referring to FIG. 2, a polysilicon layer 40 is deposited on the plurality of ONO floating gate structures 20 and the buried oxide layer 32. A structure of the polysilicon control gate is defined by photolithographic technology for forming a plurality of word lines. Then, as illustrated in FIG. 2, a contact surface is formed between the deposited polysilicon layer 40 and the plurality of ONO floating gate structures 20. This is a contact surface of a common channel so that after programming the NROM memory cells for writing data, part of the charges trapped in the floating gate will flow out through this contact surface, thereby, the data retention is finite so as to effect the reliability of the memory cells.

SUMMARY OF THE INVENTION

Accordingly, the primary object of the present invention is to provide a nitride ready only memory cell with two top oxide layers and the method of manufacturing the same, the top oxide layer cover the surface of the ONO structure so that a protecting layer is formed on the periphery of the silicon nitride layer in the ONO structure, thereby, the silicon nitride layer has no chance to be communicated with the polysilicon layer. Therefore, the problem encountered in the prior art can be overcome completely.

Another object of the present invention is to provide a nitride ready only memory cell with a preferred ability for retaining data.

Another object of the present invention is to provide a nitride ready only memory cell with two top oxide layers and the method of manufacturing the same, wherein electric charges are effectively trapped in the silicon nitride layer of the ONO structure. Therefore, no extra thermal budget is required.

To achieve the object, by high temperature oxidation (HTO), a more oxide layer is deposited on the floating gate of the ONO structure (Oxide-Nitride-Oxide structure) as a protecting layer so as to prevent the charges trapped in the silicon nitride layer of the ONO floating gate from being discharged between a polysilicon layer and a nitride layer so as to increase the reliability of the memory.

The various objects and advantages of the present invention will be more readily understood from the following detailed description when read in conjunction with the appended drawing.

DETAILED DESCRIPTION OF THE PREFERRED EMBODIMENTS

In the present invention, by high temperature oxidation, a more oxide layer is deposited on the floating gate of the ONO structure (Oxide-Nitride-Oxide structure) as a protecting layer so as to prevent the charges trapped in the silicon nitride layer of the ONO floating gate from being discharged between a polysilicon layer and a nitride layer so as to increase the reliability of the memory.

Figure 1:
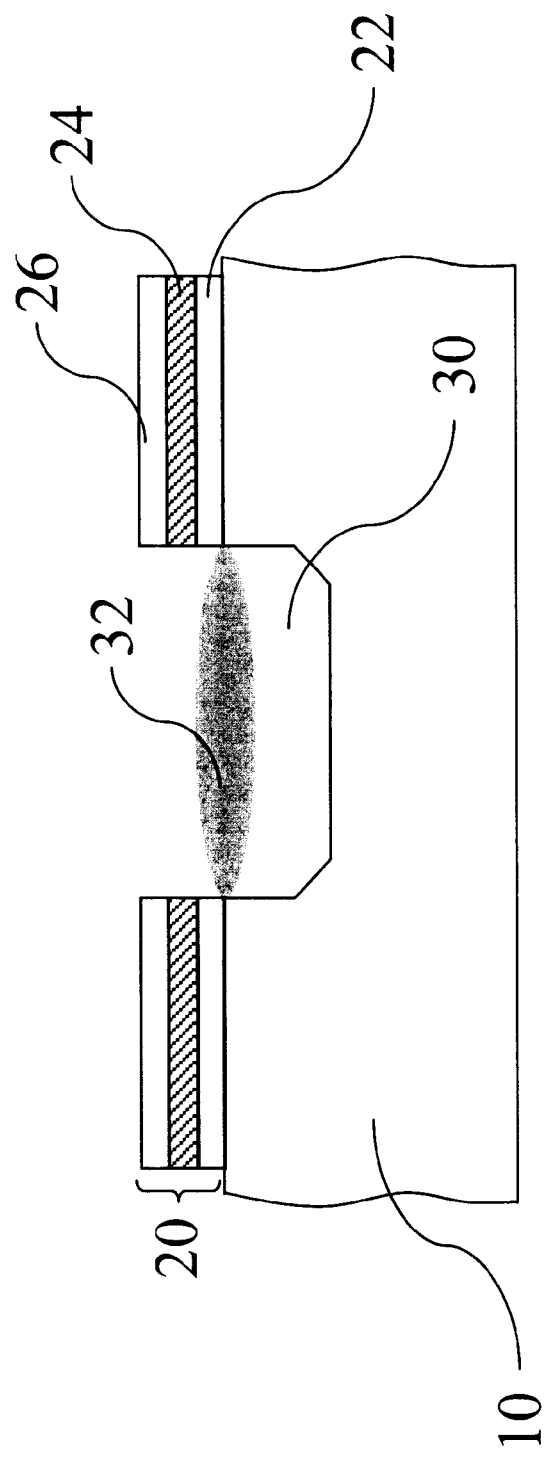
FIGS. 1 and 2 show the partial structural cross sectional view of the prior nitride ready only memory cell.
Figure 2:
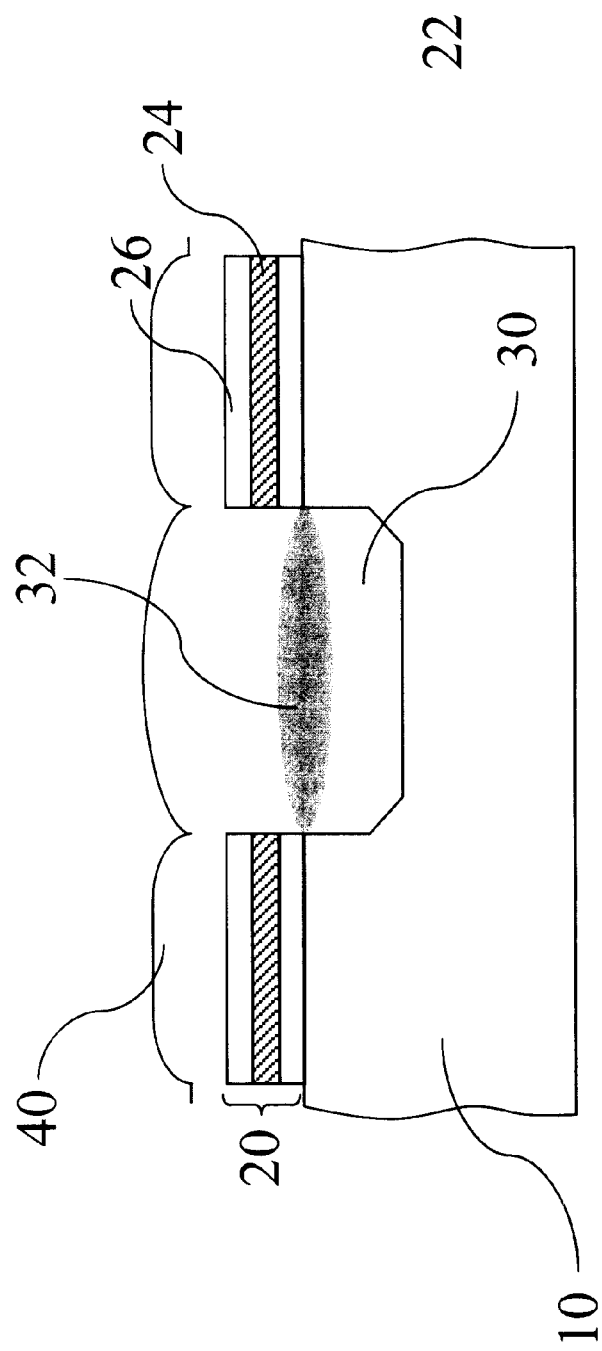
Figure 3:
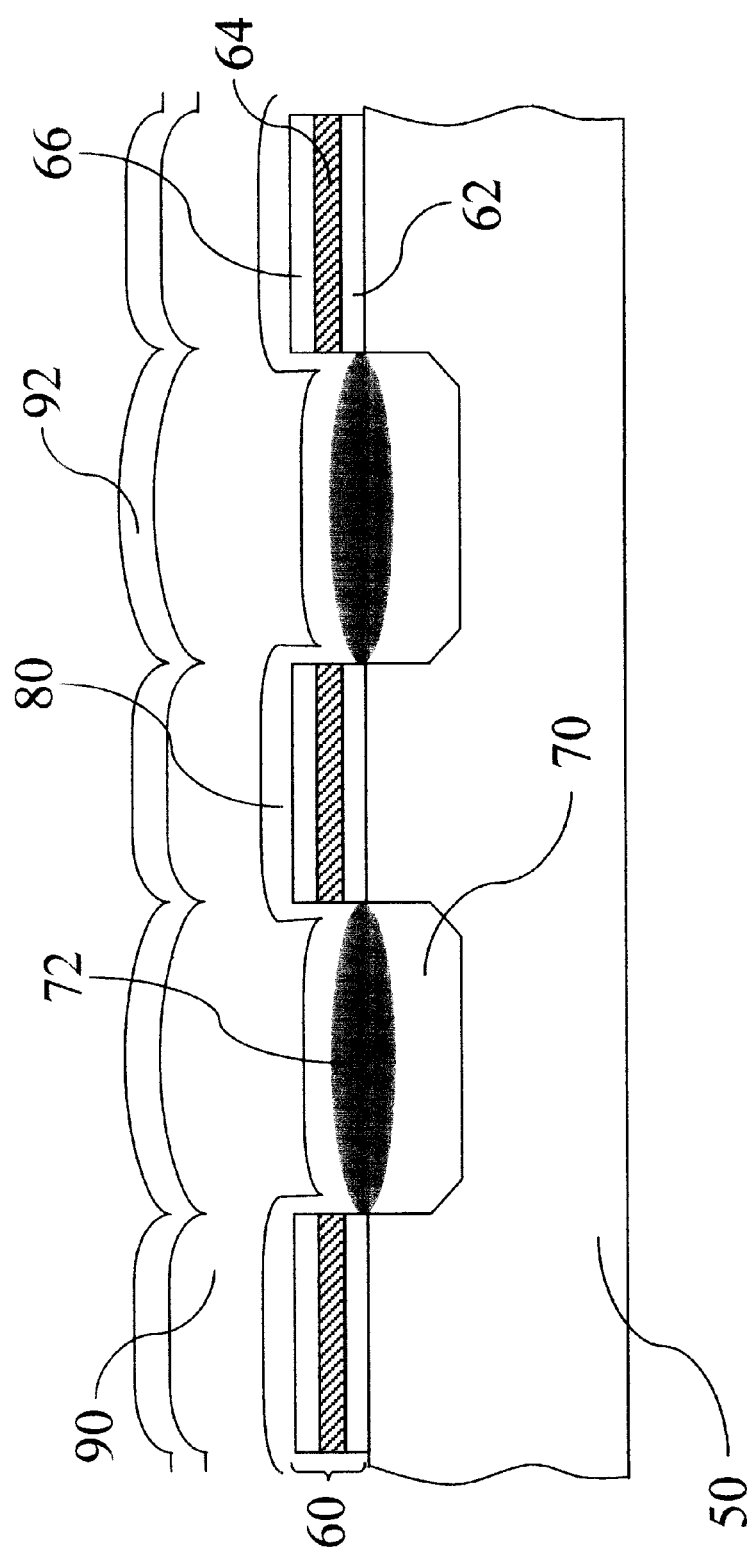
FIG. 3 is a structural schematic view of the nitride ready only memory cell of the present invention.

FIG. 3 is a schematic view of the nitride ready only memory cell of the present invention. As shown in the figures, a plurality of ONO structures 60 are installed on a semiconductor substrate 50 (in general, silicon wafer) as a floating gate. Each ONO structure 60 is formed with a silicon oxide layer 62 arranged at a lower side, a silicon nitride layer 64 arranged at a middle section, and a silicon oxide layer 66 arranged at an upper side. A plurality of buried ion diffusion areas 70 are disposed on the semiconductor substrate 50 between the ONO structures 60. A top oxide 80 covers on the surfaces of the ONO structures 60 and the buried ion diffusion areas 70 as a protecting layer of the ONO structures 60 to avoid the charge to flow out of the silicon nitride layer 64. Furthermore, a plurality of buried oxide layers 72 are positioned on the buried ion diffusion areas 70, respectively. Finally, a plurality of polysilicon word lines 90 are installed on the top oxide 80 as a polysilicon control gate.

The manufacturing method of the present invention will be described based on the structure of the aforesaid memory cell. FIG. 4 shows a schematic flow diagram for manufacturing the nitride ready only memory cell of FIG. 3. As shown in the figure, the manufacturing method comprises the following steps: providing a semiconductor substrate 50 with a former manufacturing stages of the memory cell, as illustrated in FIG. 4. Forming an ONO structure 60 on the surface of the semiconductor substrate 50; in detail, a thermal oxidation firstly is used to deposit a silicon oxide layer 62 with a thickness of 30 to 100 Å on the semiconductor substrate 50 as a bottom oxide layer of the ONO layer 60'; then a silicon nitride layer 64 with a thickness of 30 to 100 Å is deposited on the silicon oxide layer 62 by CVD method, which is a middle layer of the ONO layer as a floating gate for storing charges; next, using thermal nitridation method to deposit a silicon oxide layer 66 having a thickness of 30 to 100 Å on the silicon nitride layer 64 as a top oxide layer of the ONO layer 60'.

Figure 4A:
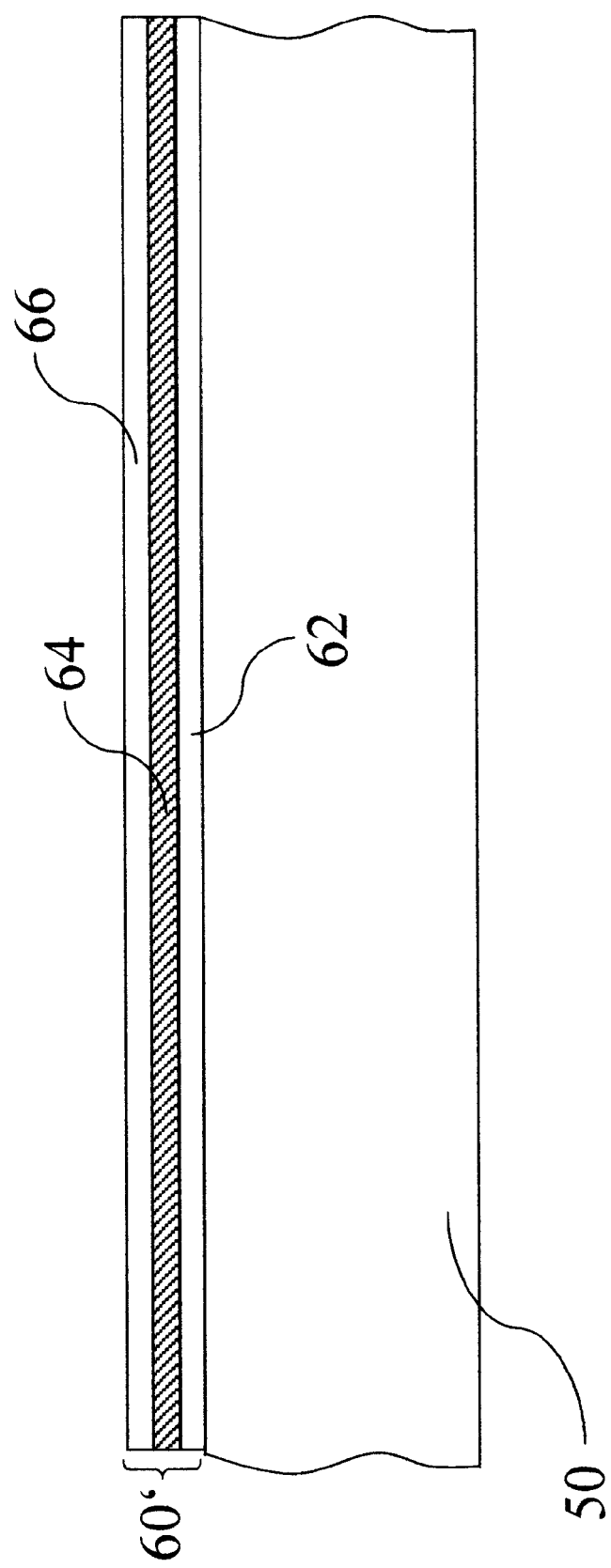
FIGS. 4A to 4D are structural schematic view showing each step in manufacturing the memory cell of the present invention.
Figure 4B:
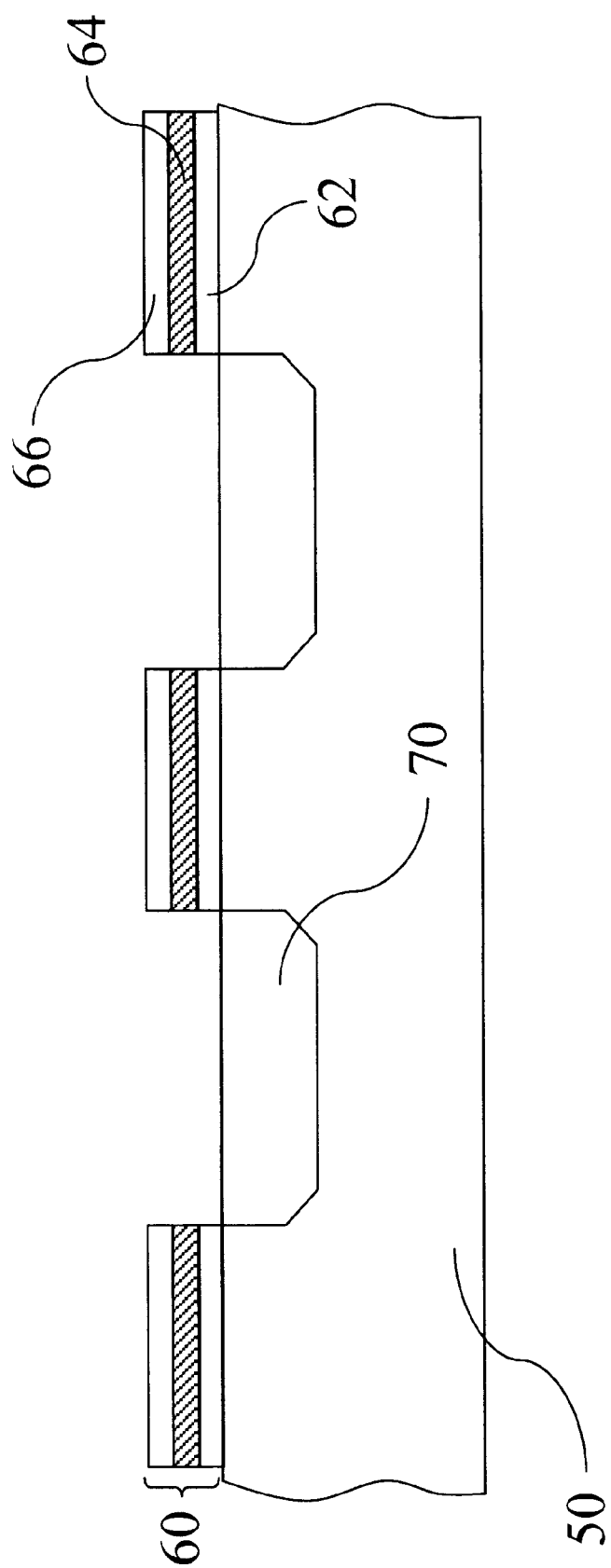

Next, the photolithographic and etching processes are performed for forming a plurality of ONO structures 60 as floating gates as illustrated in FIG. 4B; implanting ions on the semiconductor substrate 50 between the ONO structures 60 for forming a plurality of buried ion diffusion area (BD) 70.

Figure 4C:
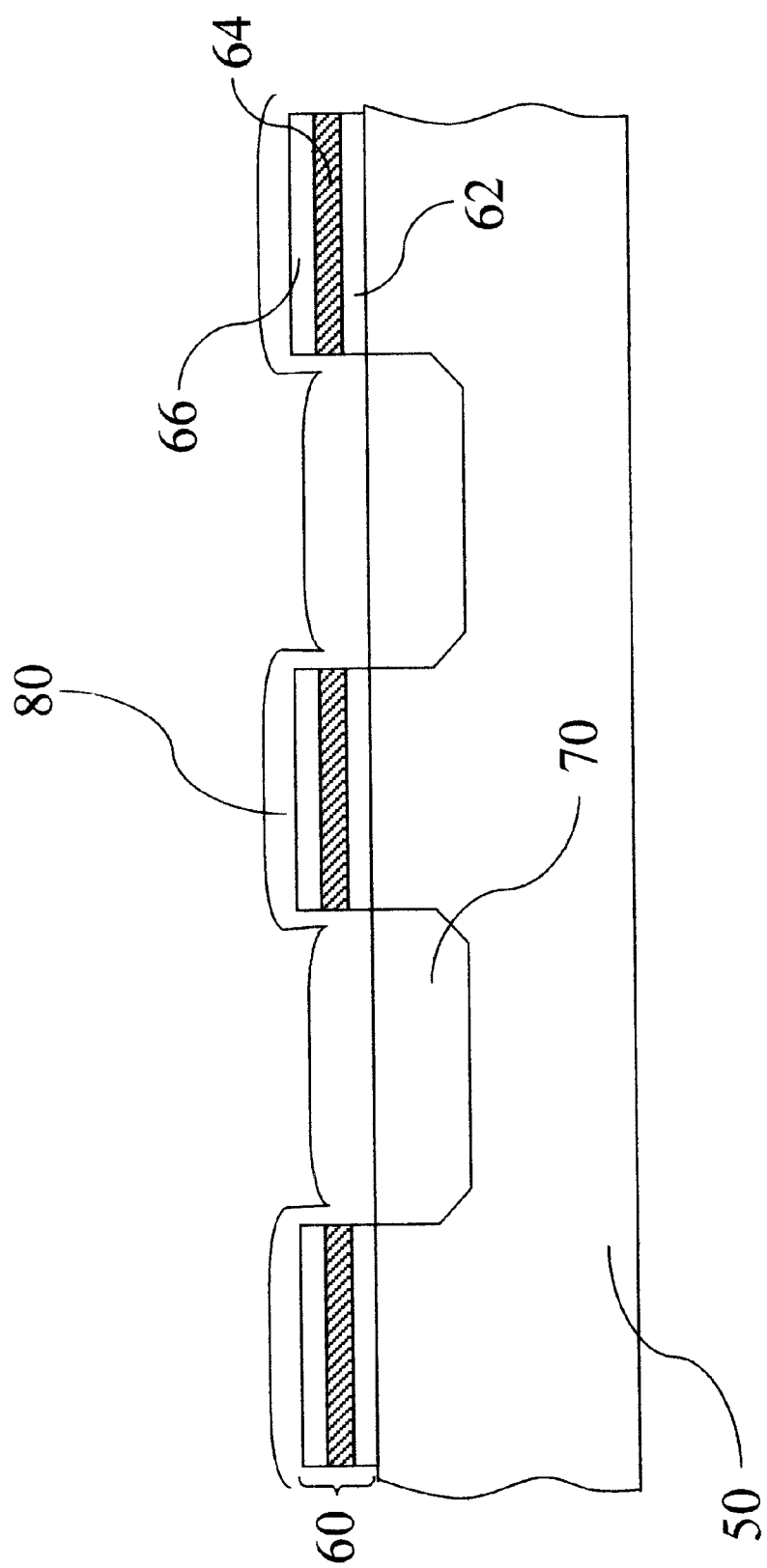

Referring to FIG. 4C, after the ion has been implanted, a top oxide layer 80 with a thickness of 20~100 Å is formed on the surface of the ONO structure 60 and the buried ion diffusion area 70 on the ONO structure 60 by HTO, which is the second top oxide layer 80 of the ONO structure 60 so that it can cover completely the ONO structure 60 and the buried ion diffusion area 70.

Figure 4D:
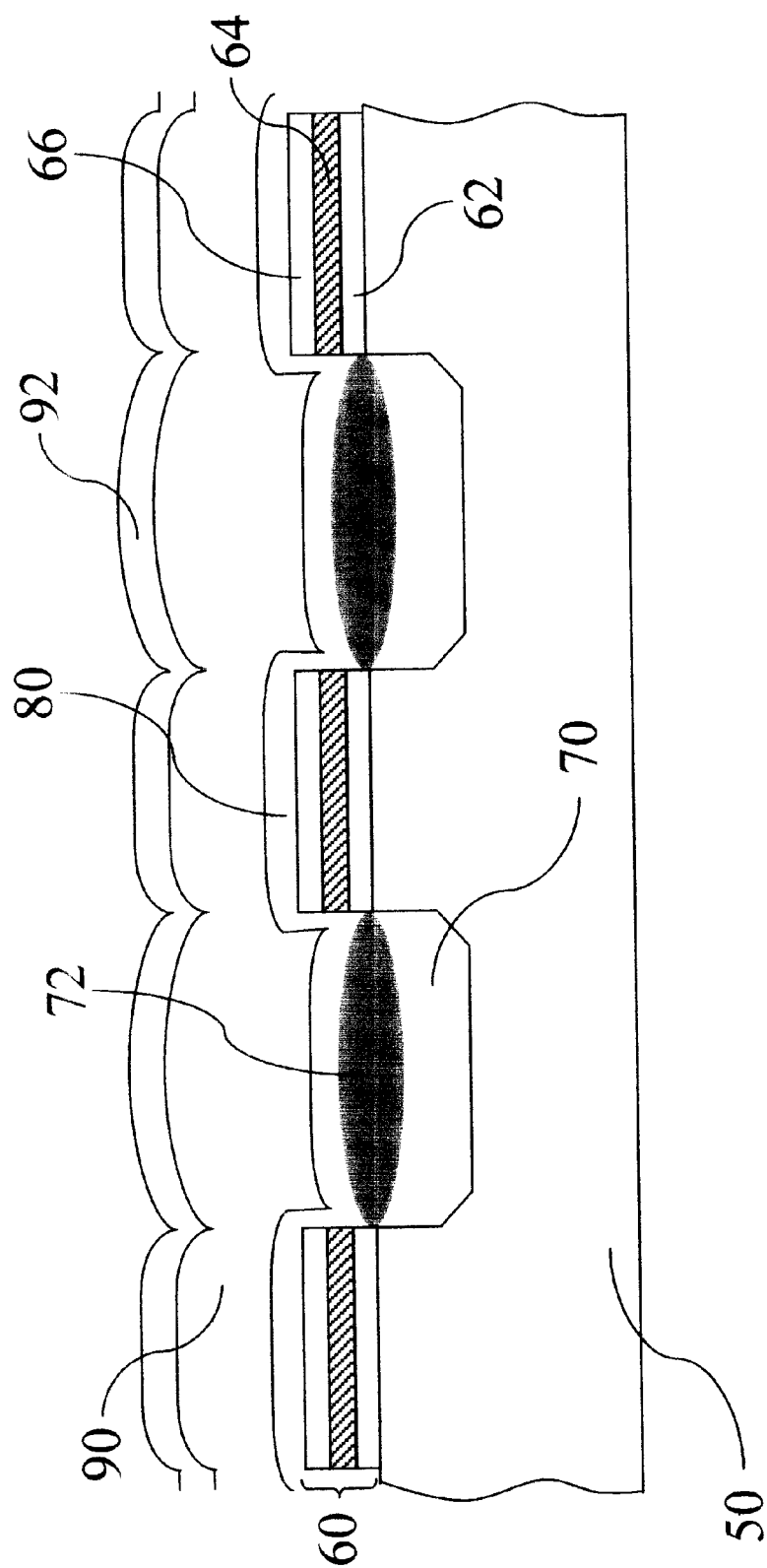

Finally, referring to FIG. 4D, a buried oxide layer (BD oxide) 72 is formed on the buried ion diffusion area 70 by wet oxidation. Then a polysilicon layer 90 and a tungsten silicon layer 92 are deposited on the top oxide layer 80 sequentially. Then, the structure of the polysilicon word line is defined by photolithographic technology for being used as a control gate. After the control gate is completed, the succeeding process is performed according to the standard manufacturing process of the general NORM memory cell.

Other than above embodiment, in the present invention, a different manufacturing method is used to derive the same structure of the nitride ready only memory cell. After forming a plurality of oxide-nitride-oxide structure 60, a buried oxide layer 72 is first formed on the buried ion diffusion area 70 by wet oxidation. Then a top oxide layer 80 is formed on the surface of the ONO structure 60 and the buried ion diffusion area 70. The details of the other steps can refer to above description, and thus the details will not be further described herein.

In nitride ready only memory cell of the present invention, the top oxide layer 80 covers the surface of the ONO structure 60 so that a protecting layer is formed on the periphery of the silicon nitride layer 64 in the ONO structure 60, thereby, the silicon nitride layer 64 has no chance to be communicated with the polysilicon layer 90. Therefore, the problem encountered in the prior art can be overcome completely. Therefore, by the present invention, the charges can be effectively trapped in the silicon nitride layer in the ONO structure of the nitride ready only memory cell. Not only the charge is avoided to flow out, but also the memory cell has preferred data maintenance ability so as to resolve the problem encountered by the prior nitride ready only memory cell. Furthermore, no extra thermal budget is required. As a result, the availability of the whole nitride ready only memory cell is increased.

The present invention are thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for manufacturing a nitride ready only memory cell with two top oxide layers comprising the steps of:

providing a semiconductor substrate;

forming a plurality of oxide-nitride-oxide structures on a surface of the semiconductor substrate as a floating gate;

forming a plurality of buried ion diffusion areas installed by implanting ions on the semiconductor substrate between the ONO structures;

depositing a top oxide layer covering entirely the ONO structures and surfaces of the buried ion diffusion areas;

forming a plurality of buried oxide layers on the buried ion diffusion areas, respectively; and forming a plurality of polysilicon word lines positioned above the top oxide layer.

2. The method as claimed in claim 1, wherein the ONO structure is formed with a silicon oxide layer arranged at a lower side, a silicon nitride layer arranged at a middle section, and a silicon oxide layer arranged at an upper side.

3. The method as claimed in claim 2, wherein, the upper silicon oxide layer is nitridized to be as a nitridized silicon oxide layer.

4. The method as claimed in claim 1, wherein the buried ion diffusion area is a N type ion diffusion region.

5. The method as claimed in claim 1, wherein the top oxide layer is formed by deposition with high temperature oxidation (HTO) method.

6. The method as claimed in claim 1, wherein a thickness of the top oxide layer is about 20~100 Å.

7. A method for manufacturing a nitride ready only memory cell with two top oxide layers comprising the steps of:

providing a semiconductor substrate;

forming a plurality of oxide-nitride-oxide structures on a surface of the semiconductor substrate as a floating gate;

forming a plurality of buried ion diffusion areas installed by implanting ions on the semiconductor substrate between the ONO structures;

forming a plurality of buried oxide layers on the buried ion diffusion areas, respectively;

depositing a top oxide layer covering entirely the ONO structures and surfaces of the buried ion diffusion areas; and forming a plurality of polysilicon word lines positioned above the top oxide layer.

8. The method as claimed in claim 7, wherein the ONO structure is formed with a silicon oxide layer arranged at a lower side, a silicon nitride layer arranged at a middle section, and a silicon oxide layer arranged at an upper side.

9. The method as claimed in claim 8, wherein, the upper silicon oxide layer is nitridized to be as a nitridized silicon oxide layer.

10. The method as claimed in claim 7, wherein the buried ion diffusion area is a N type ion diffusion region.

11. The method as claimed in claim 7, wherein the top oxide layer is formed by deposition with high temperature oxidation (HTO) method.

12. The method as claimed in claim 7, wherein a thickness of the top oxide layer is about 20~100 Å.

* * * * *